(12) United States Patent
Hanya (10) Patent No.: US 10,383,214 B2
(45) Date of Patent: Aug. 13, 2019

(54) ELECTRONIC DEVICE, METHOD FOR PRODUCING SAME, AND CIRCUIT SUBSTRATE

(71) Applicant: STANLEY ELECTRIC CO., LTD., Meguro-ku, Tokyo (JP)

(72) Inventor: Akihiko Hanya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/560,439

(22) PCT Filed: Mar. 17, 2016

(86) PCT No.: PCT/JP2016/058525
§ 371 (c)(1),
(2) Date: Sep. 21, 2017

(87) PCT Pub. No.: WO2016/152725
PCT Pub. Date: Sep. 29, 2016

(65) Prior Publication Data
US 2018/0070440 A1 Mar. 8, 2018

(30) Foreign Application Priority Data
Mar. 25, 2015 (JP) ................. 2015-063313

(51) Int. Cl.
*H01R 13/66* (2006.01)
*H05K 1/02* (2006.01)
(Continued)

(52) U.S. Cl.
CPC ......... *H05K 1/0231* (2013.01); *H05K 1/0265* (2013.01); *H05K 1/097* (2013.01);
(Continued)

(58) Field of Classification Search
CPC . H01L 21/481; H01L 23/49827; H01L 24/33; H01L 24/36; H01L 24/83;
(Continued)

(56) References Cited

U.S. PATENT DOCUMENTS 5,780,162 A * 7/1998 Toyoda ................. H01L 21/481
257/E23.009
7,294,366 B2 11/2007 Renn et al.
(Continued)

FOREIGN PATENT DOCUMENTS

JP 49121171 A 11/1974
JP 61244094 A 10/1986
(Continued)

OTHER PUBLICATIONS

Related U.S. Appl. No. 15/568,540; First Named Inventor: Akihiko Hanya; Title: "Resistor Production Method, Resistor and Electronic Device"; filed Oct. 23, 2017.
(Continued)

*Primary Examiner* — Jean F Duverne
(74) *Attorney, Agent, or Firm* — Holtz, Holtz & Volek PC (57) ABSTRACT

An electronic device capable of supplying a large current to a circuit pattern containing conductive nanoparticles includes a substrate, a region provided on the substrate, configured to mount an electronic component therein, a first circuit pattern placed within the region and electrically connected to the electronic component, a second circuit pattern connected to the first circuit pattern and configured to supply current to the first circuit pattern from outside of the region. At least a part of the first circuit pattern includes a layer obtained by sintering conductive nanosized particles with a diameter of less than 1 μm. The second circuit pattern is thicker than the first circuit pattern.

12 Claims, 4 Drawing Sheets

(51) Int. Cl.
*H05K 1/09* (2006.01)
*H05K 3/12* (2006.01)
*H05K 3/34* (2006.01)

(52) U.S. Cl.
CPC ......... *H05K 3/1283* (2013.01); *H05K 3/3494* (2013.01); *H01L 2224/16225* (2013.01); *H05K 1/095* (2013.01); *H05K 3/125* (2013.01); *H05K 3/1275* (2013.01); *H05K 2201/0108* (2013.01); *H05K 2201/0391* (2013.01); *H05K 2201/09727* (2013.01); *H05K 2201/09736* (2013.01); *H05K 2203/1131* (2013.01); *H05K 2203/1581* (2013.01)

(58) Field of Classification Search
CPC ........ H01L 2224/16225; H05K 1/0231; H05K 1/02; H05K 1/09; H05K 3/10
USPC ....................................... 439/620.1
See application file for complete search history.

(56) References Cited

U.S. PATENT DOCUMENTS

| | | | |
|---|---|---|---|
| 7,713,350 | B2 | 5/2010 | Yadav |
| 8,592,814 | B2 | 11/2013 | Yamazaki et al. |
| 9,812,621 | B2 | 11/2017 | Ishihara et al. |
| 2003/0108664 | A1 | 6/2003 | Kodas et al. |
| 2003/0161959 | A1 | 8/2003 | Kodas et al. |
| 2003/0175411 | A1 | 9/2003 | Kodas et al. |
| 2004/0170820 | A1 | 9/2004 | Yadav et al. |
| 2004/0180203 | A1 | 9/2004 | Yadav et al. |
| 2004/0239861 | A1 | 12/2004 | Uchida |
| 2005/0129383 | A1 | 6/2005 | Renn et al. |
| 2005/0196711 | A1 | 9/2005 | Shiroguchi et al. |
| 2005/0276912 | A1 | 12/2005 | Yamamoto et al. |
| 2006/0068080 | A1 | 3/2006 | Yadav et al. |
| 2006/0097368 | A1 | 5/2006 | Seko |
| 2006/0159899 | A1 | 7/2006 | Edwards et al. |
| 2006/0163744 | A1 | 7/2006 | Vanheusden et al. |
| 2006/0210705 | A1 | 9/2006 | Itoh et al. |
| 2007/0019028 | A1 | 1/2007 | Renn et al. |
| 2007/0104877 | A1 | 5/2007 | Kodas et al. |
| 2007/0104878 | A1 | 5/2007 | Kodas et al. |
| 2007/0117271 | A1 | 5/2007 | Kodas et al. |
| 2007/0122932 | A1 | 5/2007 | Kodas et al. |
| 2007/0154634 | A1 | 7/2007 | Renn |
| 2007/0178232 | A1 | 8/2007 | Kodas et al. |
| 2007/0178616 | A1 | 8/2007 | Arai et al. |
| 2007/0279182 | A1 | 12/2007 | Kodas et al. |
| 2008/0093594 | A1 | 4/2008 | Honda et al. |
| 2008/0165513 | A1 | 7/2008 | Inoue et al. |
| 2008/0286488 | A1 | 11/2008 | Li et al. |
| 2008/0290787 | A1 | 11/2008 | Cok |
| 2009/0114922 | A1 | 5/2009 | Shiroguchi et al. |
| 2009/0179230 | A1 | 7/2009 | Yamamoto et al. |
| 2009/0274833 | A1 | 11/2009 | Li et al. |
| 2010/0000762 | A1 | 1/2010 | Yang et al. |
| 2010/0003791 | A1 | 1/2010 | Maeda et al. |
| 2010/0112195 | A1 | 5/2010 | Kodas et al. |
| 2011/0096388 | A1 | 4/2011 | Agrawal et al. |
| 2011/0207328 | A1 | 8/2011 | Speakman |
| 2011/0293851 | A1* | 12/2011 | Bollstrom ............ B41M 5/5218 427/536 |
| 2012/0055013 | A1 | 3/2012 | Finn |
| 2012/0119200 | A1 | 5/2012 | Ueno et al. |
| 2014/0138710 | A1* | 5/2014 | Ohtsu ..................... H01L 24/83 257/77 |
| 2014/0191399 | A1* | 7/2014 | Ando ...................... H01L 24/36 257/746 |
| 2014/0327024 | A1 | 11/2014 | Ishihara et al. |
| 2014/0327844 | A1 | 11/2014 | Hwang et al. |
| 2014/0374775 | A1* | 12/2014 | Saito ...................... H01L 24/33 257/77 |
| 2015/0028085 | A1 | 1/2015 | Endoh et al. |
| 2015/0197063 | A1 | 7/2015 | Shinar et al. |
| 2016/0205726 | A1 | 7/2016 | Spielmann et al. |
| 2016/0272488 | A1* | 9/2016 | Ogashiwa ......... H01L 23/49827 |

FOREIGN PATENT DOCUMENTS

| | | |
|---|---|---|
| JP | 03020907 A | 1/1991 |
| JP | 10199705 A | 7/1998 |
| JP | 2006032916 A | 2/2006 |
| JP | 2006165517 A | 6/2006 |
| JP | 2008153536 A | 7/2008 |
| JP | 2010108696 A | 5/2010 |
| JP | 2011527089 A | 10/2011 |
| JP | 2014017364 A | 1/2014 |
| JP | 2014075461 A | 4/2014 |
| JP | 2014116315 A | 6/2014 |
| WO | 2004103043 A1 | 11/2004 |
| WO | 2013108408 A1 | 7/2013 |

OTHER PUBLICATIONS

Related U.S. Appl. No. 15/560,445; First Named Inventor: Akihiko Hanya; Title: "Method for Prodcuing Electronic Device, and Electronic Device"; filed Sep. 21, 2017.
International Search Report (ISR) and Written Opinion dated Jun. 7, 2016 issued in International Application No. PCT/JP2016/058525.
English language International Preliminary Report on Patentability dated Oct. 5, 2017 issued in International Application No. PCT/JP2016/058525.
Office Action (Non-Final Rejection) dated Mar. 18, 2019 issued in U.S. Appl. No. 15/568,540.

* cited by examiner

FIG. 1(a)

FIG. 1(b) A-A CROSS-SECTIONAL VIEW

FIG. 1(c) B-B CROSS-SECTIONAL VIEW

ELECTRONIC DEVICE, METHOD FOR PRODUCING SAME, AND CIRCUIT SUBSTRATE

TECHNICAL FIELD

The present invention relates to an electronic device having a substrate provided with a circuit pattern thereon.

BACKGROUND ART

Conventionally, there is widely known a circuit pattern forming method that performs copper foil masking followed by etching. This method is, however, complicated in production process and time consuming, and needs expensive production equipment. In recent years, a technical field referred to as printed electronics is studied actively, where a circuit pattern is formed by printing, so as to simplify the production process and to reduce cost of the production equipment.

By way of example, in the Patent Document 1, there is disclosed a technique where a non-conductive film containing copper nanoparticles is deposited by using a printer such as an ink jet printer, and thus formed film is exposed to light from above, thereby fusing the copper particles, and then a conductive circuit is formed.

PRIOR ART DOCUMENT

Patent Document

Patent Document 1
Japanese Unexamined Patent Application Publication No. 2014-116315

DISCLOSURE OF THE INVENTION

Problems to be Solved by the Invention

The Patent Document 1 discloses the method of forming the circuit pattern where the conductive nanoparticles are deposited by using the inkjet printer, or the like, thereafter fusing the nanoparticles by light exposure, allowing the circuit pattern to be drawn by thin lines, and thereby achieving high density wiring. However, it is difficult to form a thick conductive film by using nanoparticles, and large current is not allowed to pass through thus formed circuit pattern. Therefore, there is a problem that the range of usage is limited.

In addition, when conductive nanoparticles are deposited by using the ink jet printer or according to a Gravure offset printing method, conductive nanoparticles are deposited with forming a mountain shape, like a trapezoid. Therefore, there is a restriction in narrowing gaps in order to achieve high-density wiring.

An object of the present invention is to provide an electronic device that is capable of supplying large current to the circuit pattern that contains conductive nanoparticles.

Means for Solving the Problems

In order to achieve the object as described above, an electronic device according to the present invention comprises a substrate, a region provided on the substrate configured to mount an electronic component within the region, a first circuit pattern placed within the region and electrically connected to the electronic component, a second circuit pattern connected to the first circuit pattern and configured to supply current to the first circuit pattern from outside of the region, and the electronic component mounted within the region and connected to the first circuit pattern. A part or all of the first circuit pattern is made up of a layer obtained by sintering conductive nanosized particles with a particle diameter of less than 1 µm. The second circuit pattern is thicker than the first circuit pattern.

Advantage of the Invention

According to the present invention, the first circuit pattern containing conductive nanoparticles is connected to the thick-film second circuit pattern, and this allows large current to be supplied to the electronic component, and increases the range of usage.

BRIEF DESCRIPTION OF THE DRAWINGS

FIG. 1(a) is a top view, FIG. 1(b) is a cross sectional view taken along line A-A.

BEST MODE FOR CARRYING OUT THE INVENTION

An electronic device according to an embodiment of the present invention will now be described.

The electronic device according to one embodiment of the present invention comprises, a substrate, a region provided on the substrate configured to mount electronic component within the region, a first circuit pattern placed within the region and electrically connected to the electronic component, a second circuit pattern configured to supply current to the first circuit pattern from outside of the region, and the electronic component mounted within the region and connected to the first circuit pattern. A part or all of the first circuit pattern is made up of a layer obtained by sintering conductive nanosized particles with a particle diameter of less than 1 µm. The second circuit pattern is thicker than the first circuit pattern.

The circuit pattern formed by depositing conductive nanosized particles with a particle diameter equal to or less than 1 µm (hereinafter, referred to as "conductive nanoparticles") using an ink jet printer or the like, followed by photonic sintering, is capable of drawing thin lines. Therefore, though this allows high-density wiring, it is difficult to pass large current. In view of this property, the present invention restricts a region where the circuit pattern made up of those conductive nanoparticles is placed, connecting thereto a circuit pattern made of a thick-film conductive material, and then facilitating current supply.

In addition, the circuit pattern made of the thick-film conductive material according to the present invention may also be formed by photonic sintering of conductive particles. In this case, sintering of the conductive nanoparticles and sintering of the conductive particles of the circuit pattern made of the thick-film conductive material are both performed by using light. Therefore, this allows simplification of the production process.

Embodiments of the present invention will now be described with reference to the accompanying drawings.

Figure 1A:
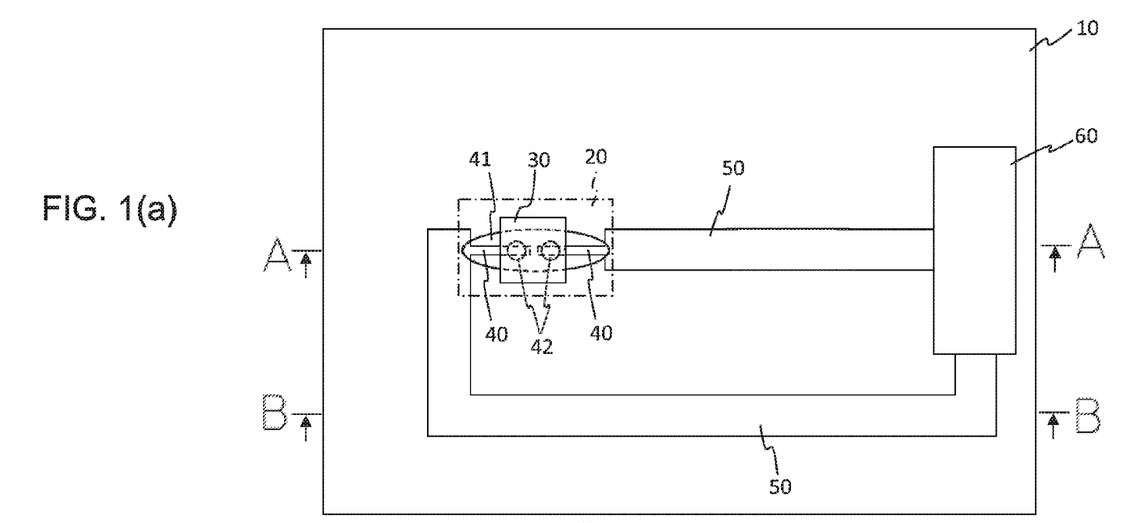
Figure 1B:
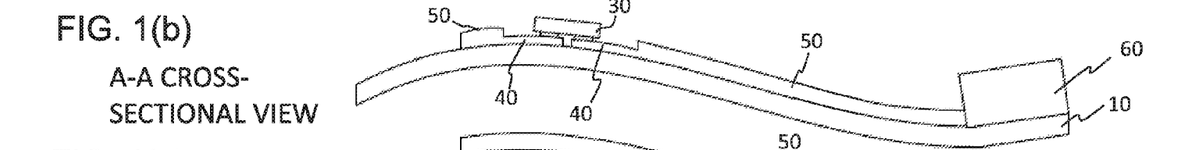
Figure 1C:
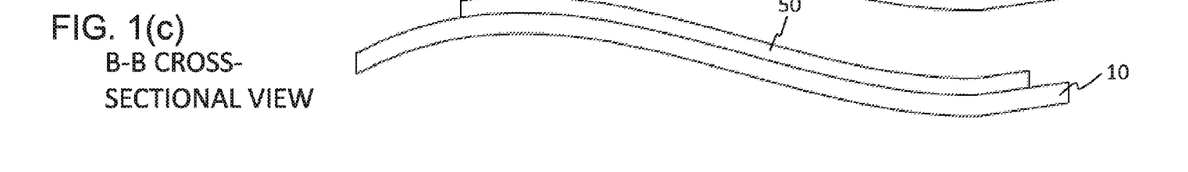
FIG. 1(c) is a cross sectional view taken along line B-B, of an electronic device according to the present embodiment.

With reference to FIGS. 1(a), 1(b), and 1(c), the electronic circuit device of the present embodiment will now be described.

The electronic circuit device as shown in FIG. 1 comprises a substrate 10 provided with a circuit pattern and an electronic component 30. On the substrate 10, there is provided a region 20 for mounting the electronic component 30, and within the region 20, a first circuit pattern 40 is placed that is electrically connected to the electronic component 30. There is placed a second circuit pattern 50 on the substrate 10, and the second circuit pattern 50 is connected to the first circuit pattern 40 on the circumferential edge of the region 20. The second circuit pattern 50 supplies current to the first circuit pattern 40 from a power source 60 that is placed outside the region 20.

A part or all of the first circuit pattern 40 is made up of a layer obtained by sintering conductive nanoparticles with the particle diameter of less than 1 μm. This first circuit pattern 40 may be formed according to the following procedures; a solution containing the conductive nanoparticles and an insulating material, or a solution containing conductive nanoparticles coated with an insulating material layer, is applied so as to form a non-conductive film 41 containing the conductive nanoparticles coated with the insulating material, and thereafter a desired region is irradiated with light. The conductive nanoparticles irradiated with the light are fused at a temperature lower than the melting point of bulk metal, bonded together, and then the first circuit pattern 40 is formed. Since only the part irradiated with the light is sintered to form the first circuit pattern 40, it is possible to form the first circuit pattern 40 into a desired shape with high density, being suitable for the size and arrangement of the electrodes of the electronic component 30, achieving lines of the first circuit pattern 40, finer and thinner than lines of the second circuit pattern 50. Since the region not exposed to the light on the film 41 is not sintered, it maintains non-conductivity. Therefore, it remains thereon, continuous from the first circuit pattern 40. It is noted that the non-conductive region that is not sintered on the film 41 may be kept remaining, or it may be removed in a subsequent step.

Specifically, as shown in FIGS. 1(a) and 1(b), the second circuit patterns 50 are disposed at both sides of the region 20 that is configured to mount the electronic component 30. At least one pair of the first circuit patterns 40 are disposed within the region 20, and they are connected respectively with the second circuit patterns 50 on both sides of the region 20. The non-conductive layer 41 is placed between the pair of the first circuit patterns 40. The electronic component 30 is mounted in a flip-chip package on the pair of the first circuit patterns 40, via bumps 42, or the like. In FIGS. 1(a) and 1(b), the non-conductive layer 41 is placed between the first circuit patterns 40, but the non-conductive layer 41 may not be necessarily provided or it may be removed.

As shown in FIG. 1(b), the second circuit pattern 50 is thicker than the first circuit pattern 40. Since the first circuit pattern 40 is formed by sintering the conductive nanoparticles, it is difficult to be formed with a certain thickness. Therefore, if the first circuit pattern 40 is formed along with extended to the power source 60, electrical resistance of the thin first circuit pattern 40 becomes large. Accordingly, this may prevent a supply of large current to the electronic component 30. In the present embodiment, the first circuit pattern 40 is formed only in the region 20 for mounting the electronic component 30 that needs fine wiring, and the outside of the region 20 comprises the second circuit pattern 50 that is made up of a thick film, thereby reducing resistance so as to allow large current to be supplied to the electronic component 30.

In addition, a part or all of the second circuit pattern 50 may comprise a layer obtained by sintering conductive particles by light irradiation. In this situation, conductive nanoparticles with the particle diameter less than 1 μm and microsized conductive particles with the particle diameter of 1 μm or larger (hereinafter, referred to as "conductive microparticles") are mixed and used as the conductive particles. Accordingly, when the conductive particles are irradiated with light, the conductive nanoparticles are fused earlier, and then bonded to the surrounding conductive microparticles. Therefore, using the conductive nanoparticles as starting points, the conductive microparticles can be sintered at a lower temperature than the bulk by light irradiation. Mixing the conductive microparticles with the conductive nanoparticles allows a thick layer to be formed relatively easily, and further, they are sintered by light irradiation, so as to make the second circuit pattern.

In FIG. 1, the power source 60 is mounted on the substrate 10, but the power source 60 is not necessarily mounted on the substrate 10. By way of example, the substrate 10 may be provided with a connector instead of the power source 60. In this case, the power source that is not mounted on the substrate 10 may be connected to the connector via a cable, or the like. The connector is attached to the second circuit pattern. A generator system such as a solar battery may be employed as the power source 60.

As shown in FIGS. 1(b) and 1(c), the substrate 10 may have a curved shape. In this case, the first circuit pattern 40 and the second circuit pattern 50 are arranged along the surface of thus curved substrate 10. In the present embodiment, the first circuit pattern 40 and the second circuit pattern 50 can be formed, by applying a film containing conductive particles and then sintering the film by light irradiation. Therefore, by curving the substrate 10 prior to the sintering step, the circuit patterns can be formed easily on the curved substrate 10, without any wire break or line thinning.

The substrate 10 may be made of any material that is capable of supporting the first circuit pattern 40 and the second circuit pattern 50, at least the surface of the material having insulating properties, and also resistant to the light irradiation when the first circuit pattern 40 is formed. Byway of example, there may be employed a material such as a polyethylene terephthalate (PET) substrate, a polyethylene naphth.alate (PEN) substrate, a glass epoxy substrate, a paper phenol substrate, a flexible print substrate, a ceramic substrate, a glass substrate, and a metal substrate with a surface coated with an insulating layer. When an optically transparent substrate is employed, it is possible to irradiate the back side of the substrate with the light that is used for sintering the circuit pattern. In addition, a film-like substrate may also be used as the substrate 10 of the present embodiment.

As a material of the conductive nanoparticles constituting the first circuit pattern 40, at least one of the conductive metal and conductive metal oxide such as Ag, Cu, Au, Pd, ITO, Pt, and Fe may be employed.

When the second circuit pattern 50 is formed by sintering the conductive particles, similar to the first circuit pattern 40, at least one of the aforementioned conductive metal and conductive metal oxide may be employed as the material of the conductive particles.

As the insulating material, at least contained in the non-conductive film 41 that is adjacent to the first circuit pattern 40, and used for coating the conductive nanoparticles, at least one of the followings can be employed; organic substances such as styrene resin, epoxy resin, silicone resin, and acryl resin; inorganic substances such as $SiO_2$, $Al_2O_3$, and $TiO_2$; and hybrid materials containing both organic and inorganic substances. The thickness of the insulating material layer for coating the conductive nanoparticles in the film 41 is preferably from around 1 nm to 10,000 nm. It is because, if the insulating material layer is significantly thin, a property of withstand voltage of the non-conductive film 41 is decreased. On the other hand, if the insulating material layer is significantly thick, electric conductivity of the first circuit pattern 40 after sintered by light irradiation is decreased, whereas increasing thermal resistance value.

The first circuit pattern 40 contains conductive particles with the particle diameter of 0.01 μm to 1 μm. The wiring width of the first circuit pattern 40 (sintered portion) may be equal to 1 μm or larger, for instance. The first circuit pattern 40 may be formed with the thickness around 1 nm to 10 μm. The electric resistance of the first circuit pattern 40 is preferably equal to or less than $10^{-4}$ Ω/cm, and in particular, low resistance equal to the order of $10^{-6}$ Ω/cm is more preferable.

The second circuit pattern 50 contains conductive particles with the particle diameter from 1 μm to 100 μm. The second circuit pattern 50 may be formed to have the wiring width of 10 μm or larger, and it may be formed to be around 100 μm, for instance. The second circuit pattern 50 may be formed to have the thickness around 1 μm to 100 μm, for example, around 20 μm. The electric resistance of the second circuit pattern 50 may be preferably equal to or less than $10^{-4}$ Ω/cm, and in particular, low resistance equal to the order of $10^{-6}$ Ω/cm is more preferable.

Any component may be employed as the electronic component 30. By way of example, a light emitting element (LED, LD), a light receiving element, an integrated circuit, and a display element (liquid crystal display, plasma display, EL display, or the like) may be employed. In FIG. 1, only one electronic component 30 is provided on the substrate 10. However, it is of course possible to provide two or more regions 20, so as to mount two or more electronic components 30. In this case, the second circuit pattern 50 may be formed so that plural electronic components 30 can be connected via a desired circuit pattern, such as in series and in parallel.

Next, a method of producing the electronic device as shown in FIG. 1 will be described.

<First Production Method>

The first production method of the aforementioned electronic device will be described with reference to FIG. 2.

Figure 2A:
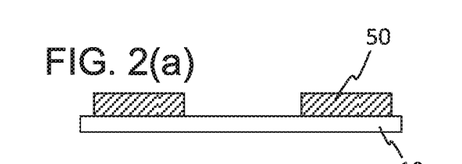
FIGS. 2(a) to 2(h) illustrate a first production method of the electronic device according to the present embodiment.

As shown in FIG. 2(a), in the first production method, there is prepared a substrate 10 on which the second circuit pattern 50 preformed in the same shape as shown in FIG. 1. A conventional method may be employed as the method for forming the second circuit pattern 50. For example, a metallic thin film is formed on the substrate 10, and thereafter, patterning of the same shape as FIG. 1 is performed by etching, thereby forming the second circuit pattern, and the substrate with thus formed pattern becomes usable. Alternatively, a solution in which conductive particles are dispersed is printed on the substrate 10 so as to form a coating in the shape of the second circuit pattern 50. Then, only heat is applied, or heat and pressure are applied, thereby sintering the conductive particles to form the second circuit pattern 50, and thus formed pattern becomes usable.

Next, in order to form the first circuit pattern, there is prepared a solution; a solution where the aforementioned conductive nanoparticles and insulating material are dispersed in a solvent, or a solution where the conductive nanoparticles coated with the insulating material layer are dispersed in a solvent. An organic solvent or water may be used as the solvent.

Figure 2B:
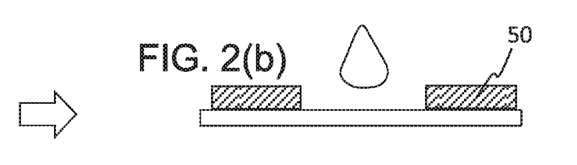
Figure 2C:
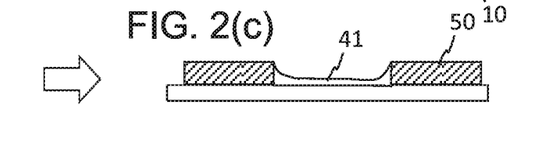

As shown in FIG. 2(b), the solution as described above is applied to the inside of the region 20 on the surface of the substrate 10, in a desired shape. The applied solution yields a smooth surface on the substrate 10 as shown in FIG. 2(c), thereby forming the coated film (film 41). The ends of the film 41 are made to overlap the ends of the second circuit patterns 50. The film 41 is heated and dried as needed. Conductive nanoparticles are dispersed in the film 41, and the circumference of the conductive nanoparticles are covered with the insulating material. Accordingly, the film 41 is non-conductive at this stage.

Figure 2D:
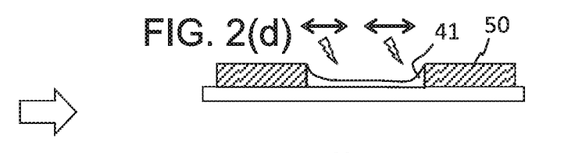
Figure 2E:
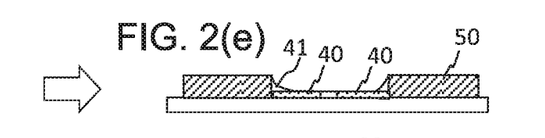

Next, as shown in FIG. 2(d), the film 41 is irradiated with light in a desired pattern, the light sinters the conductive nanoparticles, and a layer of conductive nanoparticles (the first circuit pattern 40) in a predetermined pattern is formed. The region overlapping the second circuit pattern 50 is also exposed to the light. This light irradiation allows the conductive nanoparticles to be fused at a temperature lower than the melting point of a bulk material constituting the particle. The insulating material layer on the circumference of the conductive nanoparticles is evaporated or softened by the light irradiation. Therefore, the melted conductive nanoparticles are fused to adjacent particles directly, or fused to the adjacent particles after bursting through the softened insulating material layer. Accordingly, the conductive nanoparticles are sintered with one another, and the region that is irradiated with light becomes the first circuit pattern 40 being electrically conductive. Then, as shown in FIG. 2(e), a pair of the first circuit patterns 40 are formed. It is noted that the conductive nanoparticles after exposed to light are in the state of particle-to-particle bonding, but each particle keeps its shape to some extent.

As for a wavelength of the radiated light in the step of FIG. 2(d), the light may have any wavelength, such as ultraviolet, visible, and infrared, but the wavelength absorbable by the conductive nanoparticles contained in the film 41 is selected and used. The desired pattern (the first circuit pattern 40) of the light irradiation can be formed by passing the light through a mask having an opening. When materials such as Ag, Cu, Au, and Pd are employed for the conductive nanoparticles, visible light in the range from 400 to 600 nm can be used, for instance. Alternatively, light beams collected into an irradiation diameter smaller than the wiring width of the first circuit pattern 40 are employed, and the light beams may be scanned over the desired pattern on the film 41.

The region not exposed to the light on the film 41 is not sintered, and thus it remains non-conductive. This non-conductive film 41 may be removed in a subsequent step. For example, it is possible to remove the film 41 by using an organic solvent, or the like.

Figure 2F:
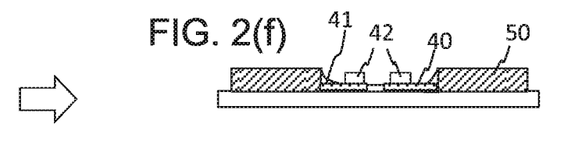

Next, as shown in FIG. 2(f), bumps 42, solder balls, or the like, may be mounted on the first circuit pattern 40, as needed.

Figure 2G:
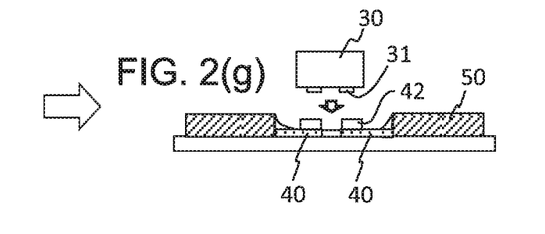
Figure 2H:
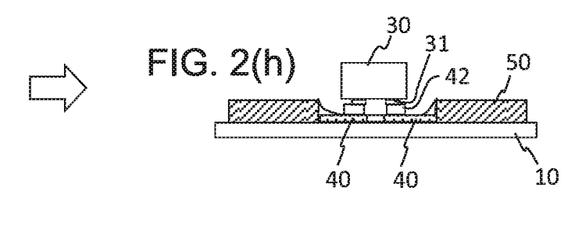

As shown in FIG. 2(g), the electronic component 30 is mounted, so that the electrodes 31 thereof are respectively aligned with the corresponding first circuit patterns 40. If the bump 42 are provided, the positions of the bumps 42 are aligned with the electrodes 31 so that the positions thereof corresponds to the electrodes 31 of the electronic component 30. Thereafter, heat or ultrasonic waves are applied, and the electrodes 31 of the electronic component 30 are connected with the first circuit patterns 40, and then the electronic component 30 is secured.

According to the steps as described above, the first circuit pattern 40 with a desired fine pattern can be formed only by simple procedures such as coating and light irradiation. In addition, it can be made in conjunction with the thick-film second circuit pattern 50. Thus, this configuration allows large current to be supplied from the low-resistance thick-film second circuit pattern 50, via the first circuit pattern 40, to the electronic component 30.

<Second Production Method>

Figure 3A:
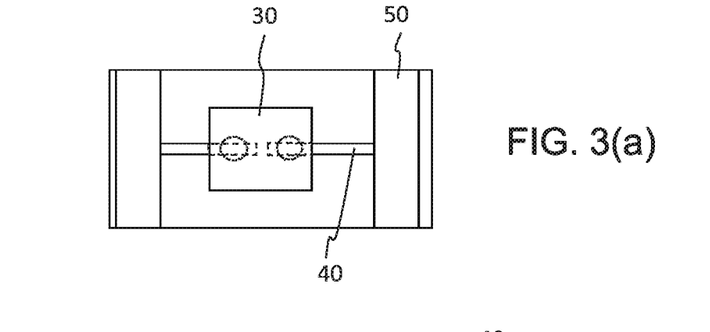
FIG. 3(a) is a top view, and 3(b) is a side view illustrating a second production method of the electronic device according to the present embodiment.
Figure 3B:
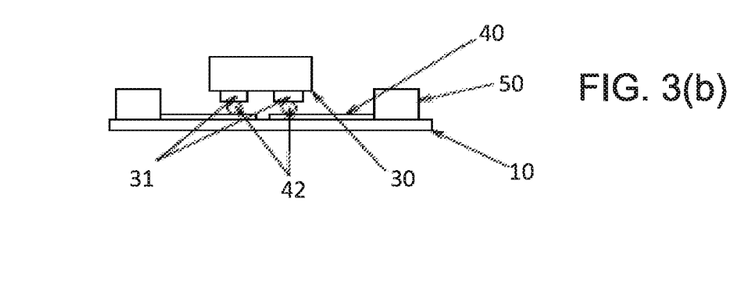

A second production method will be described, with reference to FIG. 3.

The second production method is equivalent to the first embodiment, but in the step shown in FIG. 2(*b*), a printing method is employed to form a coated film in the shape of the first circuit pattern 40, when either of the following solutions is applied to the substrate 10; a solution where conductive nanoparticles and an insulating material are dispersed in a solvent, and a solution where the conductive nanoparticles coated with an insulating material layer are dispersed in a solvent. As the printing method, ink-jet printing, flexographic printing, Gravure offset printing, or the like, may be employed.

In the step of FIG. 2(*d*), the coated film of the first circuit pattern 40 formed by printing is entirely exposed to light, so as to sinter the film, thereby forming the first circuit pattern 40.

Other steps are the same as the first production method, and thus they will not be described redundantly.

In the second production method, light irradiation of the desired pattern is not necessary in the light irradiation step, thus facilitating this light irradiation step. As shown in FIGS. 3(*a*) and 3(*b*), there is an advantage that non-conductive film 41 is not formed in the surrounding of the first circuit pattern 40.

<Third Production Method>

A third production method will be described, with reference to FIGS. 4(*a*) to 4(*h*).

According to the third production method, a substrate that allows light penetration is used as the substrate 10, and the backside of the substrate is exposed to light to form the first circuit pattern 40.

Firstly, as shown in FIG. 4(*a*), the substrate 10 on which the second circuit pattern 50 is formed in advance in the shape as shown in FIG. 1 is prepared. The substrate 10 comprises a material that allows penetration of at least a part of the radiated light for forming the first circuit pattern 40. Next, as shown in FIG. 4(*b*), a solution where conductive nanoparticles and an insulating material are dispersed, or a solution where conductive nanoparticles coated with the insulating material layer are dispersed, is applied to inside of the region 20 in a desired shape on the surface of the substrate 10. As shown in FIG. 4(*c*), the applied solution yields a smooth surface on the substrate 10, thereby forming a coated film (film 41). The end of the film 41 is made continuous from the end of the second circuit pattern 50. The film is heated and dried as needed. The conductive nanoparticles are dispersed within the film 41, and the circumferences of the conductive nanoparticles are covered by the insulating material. Therefore, the film 41 is non-conductive.

Next, as shown in FIG. 4(*d*), the electronic component 30 is mounted being aligned with a predetermined position on the film 41, and as shown in FIG. 4(*e*), the electrodes 31 of the electronic component 30 are brought into intimate contact with the film 41.

Next, as shown in FIG. 4(*f*), the film 41 is irradiated with light in a desired pattern, from the backside of the substrate 10, the light sinters the conductive nanoparticles, thereby forming a layer of conductive nanoparticles (the first circuit pattern 40) in the desired pattern. A region overlapping the second circuit pattern 50 is also exposed to light. Accordingly as shown in FIG. 4(*g*), a pair of the first circuit patterns 40 are formed, being continuous from the second circuit patterns.

The radiated light in the step of FIG. 4(*f*) may have a wavelength that is absorbed into the conductive nanoparticles contained in the film 41. At least a part of the radiated light including the wavelength that is absorbed by the conductive nanoparticles penetrates the substrate 10.

Figures 4A, 4C:
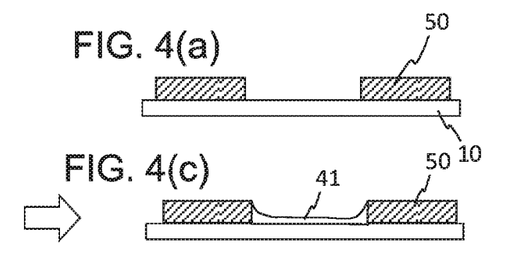
FIGS. 4(a) to 4(g) illustrate a third production method of the electronic device according to the present embodiment.
Figure 4B:
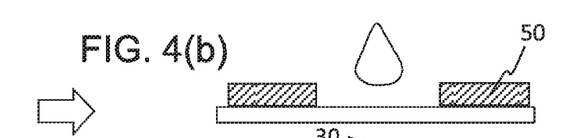
Figure 4D:
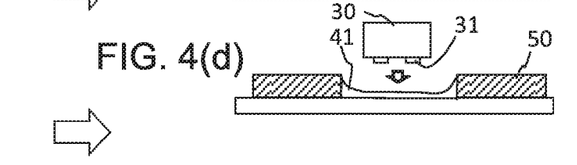
Figure 4E:
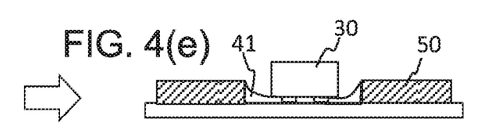
Figure 4F:
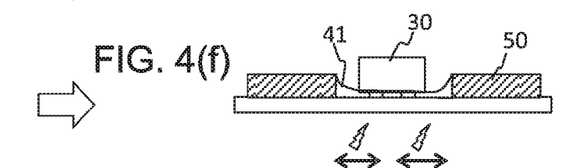
Figure 4G:
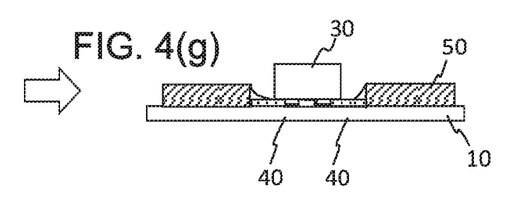
Figure 4H:
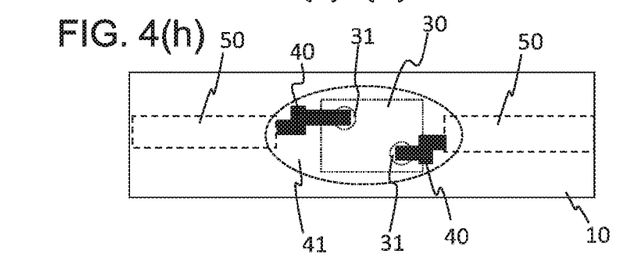
FIG. 4(h) is a bottom view of the electronic device being produced.

Since the conductive nanoparticles are fused when they are sintered, this brings binding to the electrodes 31 of the electronic component 30, thereby adhering the electrodes 31 to the first circuit pattern 40. The electrodes 31 are directly bonded to the first circuit pattern 40, and there is no bumps 42 therebetween, unlike the electronic device according to the first production method.

The radiated light has a wavelength that is absorbed by the conductive nanoparticles contained in the film 41, and the wavelength not absorbed by the substrate 10 is selected and used. A predetermined pattern of the light irradiation can be formed by radiating the light through a mask having an opening in the shape of the predetermined pattern. Light beams collected into an irradiation diameter smaller than the predetermined pattern are used, and the light beams may be scanned over the predetermined pattern on the film 41, thereby allowing only the predetermined pattern to be exposed to light.

Since sintering does not occur in the region not exposed to the light on the film 41, it remains non-conductive. This non-conductive film 41 may be removed in the subsequent step. By way of example, an organic solvent, or the like, may be used to remove the film 41.

Accordingly, as shown in FIG. 4(*h*) that illustrates the substrate 10 viewed from the backside, it is possible to form the first circuit patterns 40 that connect the electrodes 31 of the electronic component 30 with the second circuit patterns 50, in the state where the electronic component 30 is mounted. The first circuit pattern 40 is bonded to the electronic component 30 simultaneously with forming the first circuit pattern 40.

According to the third production method, light is radiated in the state where the electronic component is mounted, and thus the light irradiation is performed in the pattern that is based on the position of the electrode 31 after mounted. Therefore, the electrodes 31 of the electronic component 30 can be surely bonded to the first circuit pattern 40 with a high degree of precision.

It is further possible to achieve production, without various errors such as mounting misalignment and deviation in feeding a bonding agent, compared to the case where the electronic component is bonded to the circuit pattern that is formed in advance, and accordingly thus formed circuit pattern (the first circuit pattern 40) becomes high definition.

In the description above, upon forming the first circuit pattern 40, the region where the film 41 is formed in the steps as shown in FIGS. 4(*b*) and 4(*c*) is one region including the pair of first circuit patterns 40 (see FIG. 4(*h*)). Alternatively, two regions may be formed separately, containing the pair of the first circuit patterns 40, respectively.

<Fourth Production Method>

According to a fourth production method, the second circuit pattern 50 is formed by light irradiation.

Firstly, a substrate 10 is prepared.

Next, either of the following solutions is prepared; a solution where conductive nanoparticles, conductive microparticles, and an insulating material are dispersed in a solvent; or a solution where the conductive nanoparticles and the conductive microparticles coated with the layer of the insulating material are dispersed in a solvent. As the solvent, an organic solvent or water may be used.

The solution described above is applied to the region on the surface of the substrate 10 in a desired pattern, where the second circuit pattern 50 is to be formed. The solution being applied forms a coated film. The coated film is heated and dried as needed. The conductive nanoparticles and conductive microparticles are dispersed in the coated film, and the circumference of each particle is covered with the insulating material. Under these circumstances, the coated film is non-conductive.

Next, the coated film is exposed to light in the shape of the second circuit pattern 50. The light allows the conductive nanoparticles to fuse at a lower temperature than the conductive microparticles, and they are fused with adjacent conductive nanoparticles and conductive microparticles. As thus described, sintering occurs from the nanoparticles assumed as starting points, and this causes sintering at a temperature lower than the bulk. It is further possible to cause sintering only within the desired range in the thickness direction of the coated film. Accordingly, the second circuit pattern 50 in the desired shape can be formed.

As a wavelength of the radiated light, the wavelength that is absorbed by the conductive nanoparticles and the conductive microparticles contained in the coated film is selected and used. The shape of the second circuit pattern 50 used for the light irradiation, can be formed by a mask having a predetermined opening. It is alternatively possible that light beams collected into an irradiation diameter smaller than the wiring width of the second circuit pattern 50 are used, and scanning of the light beams allows only the second circuit pattern 50 to be exposed to light.

Since sintering does not occur in the region on the coated film, where not exposed to light, this region remains non-conductive.

When an optically transparent substrate 10 is employed in the light irradiation step, it is possible to irradiate the back side of the substrate with the light, in a similar manner as the step as shown in FIG. 4(*f*).

In the aforementioned production method, it is described that the coated film is formed in a range wider than the region corresponding to the second circuit pattern 50, and only the region corresponding to the second circuit pattern 50 is irradiated with light. It is further possible to employ a printing method, and the coated film may be formed by printing a solution where conductive particles are dispersed in the shape of the second circuit pattern 50. In this case, the coated film formed by printing is entirely exposed to light, thereby forming the second circuit pattern 50.

After forming the second circuit pattern according to the steps as described above, any of the first to third production methods is performed to produce the electronic device.

<Fifth Production Method>

In the fourth method, it is described that the second circuit pattern is formed on the substrate 10 and thereafter any of the first to the third production methods is performed. Is the fifth production method, firstly formed is the coated film serving as the second circuit pattern 50 according to the fourth production method, and then, without the light irradiation, any of the first to the third production methods is performed to form the film 41 serving as the first circuit pattern 40.

Then, photonic sintering of the second circuit pattern 50 and the first circuit pattern 40 is performed sequentially or simultaneously. It is to be noted here that the region serving as the second circuit pattern 50 is irradiated with light having a wavelength absorbed by the conductive particles in the coated film for the second circuit pattern 50, and the region serving as the first circuit pattern 40 is irradiated with light having a wavelength absorbed by the conductive nanoparticles in the film 41. Strength of the radiated light is adjusted to be the strength that allows each of the second circuit pattern 50 and the first circuit pattern 40 to be sintered.

Thereafter, any of the first to the third production methods is performed, so as to complete the electronic device.

As thus described, sintering of the second circuit pattern 50 and the first circuit pattern 40 by the light irradiation is performed sequentially or simultaneously, and thus the light irradiation steps in the entire production process can be performed at one time. Accordingly, the production efficiency is improved.

In the fourth production method, the sequence of the step of forming the second circuit pattern 50 and the step of forming the first circuit pattern 40 may be altered, and the second circuit pattern 50 may be formed after forming the first circuit pattern 40. Similarly, in the fifth embodiment, the sequence of forming the coated film of the second circuit pattern 50 and forming the film 41 of the first circuit pattern 40 may be altered, and the coated film of the second circuit pattern 50 may be formed after forming the film 41 of the first circuit pattern 40. Thereafter, both circuit patterns are irradiated with light sequentially or simultaneously.

If the substrate 10 is curved, it is preferable in the first to the third production methods to curve the substrate 10 prior to forming the second pattern 50 so as to prevent wire break or line thinning of the second circuit pattern 50. In the fourth and the fifth production methods, the substrate 10 is curved by the time of the initial light irradiation step, and thereby preventing wire break or line thinning of the first and the second circuit patterns.

The electronic device according to the aforementioned embodiments allows the first circuit pattern 40 to be formed by light irradiation, thereby achieving high-density wiring, and enabling high-density packaging. In addition, the first circuit pattern 40 is coupled to the thick-film second circuit pattern 50, thereby supplying large current to the electronic component 30 via the low-resistance second circuit pattern 50, producing an effect that more and wider variety of electronic components 30 can be mounted.

Therefore, according to the present embodiment, various electronic components with high density are mounted on the substrate 10, and further the electronic device can be produced by collective packaging through less production steps. In addition, since the circuit pattern can be easily changed by light irradiation, design changes may be addressed easily.

In addition, also the second circuit pattern 50 can be formed by light irradiation, and in that case, it is possible to simplify the production process.

The electronic device of the present embodiment is applicable to any device that is equipped with electronic component on a substrate. By way of example, it is applicable to a device such as an instrument panel of a vehicle, and a monitor of a gaming machine. Since the substrate is allowed to bend, it is applicable to a wearable (body wearable) electronic device (such as glasses, a watch, a display, and medical equipment), and a curved display.

DESCRIPTION OF SYMBOLS

10 . . . substrate, 20 . . . region for mounting electronic component, 30 . . . electronic component, 40 . . . the first circuit pattern, 41 . . . film, 42 . . . bump, 50 . . . the second circuit pattern, 60 . . . power source

What is claimed is:

1. A method of producing an electronic device including a substrate, a region provided on the substrate and configured to mount an electronic component therein, a first circuit pattern placed within the region and electrically connected to the electronic component, a second circuit pattern connected to the first circuit pattern and configured to supply current to the first circuit pattern from outside of the region, and the electronic component mounted within the region and connected to the first circuit pattern, wherein at least a part of the first circuit pattern comprises a layer obtained by sintering conductive nanosized particles with a particle diameter of less than 1 μm, and the second circuit pattern is thicker than the first circuit pattern, the method comprising:

step 1: forming a film by applying:
a solution wherein the conductive nanosized particles with a particle diameter of less than 1 μm and an insulating material are dispersed, or
a solution wherein the conductive nanosized particles coated with a layer of the insulating material are dispersed,
to a surface of the substrate in a desired pattern, step 2: forming the first circuit pattern of a layer of the conductive nanosized particles in a predetermined pattern by irradiating the film with light in the predetermined pattern and sintering the conductive nanosized particles by the light, step 3: connecting electrodes of the electronic component with the layer of the conductive nanosized particles, after the electronic component is mounted on the film, and step 4: forming the second circuit pattern on the surface of the substrate, continuously from the first circuit pattern, wherein the second circuit pattern is formed with a film that is thicker than the first circuit pattern.

2. The method according to claim 1, wherein the film, after the first circuit pattern is formed, comprises a non-conductive layer which is continuous from the layer obtained by sintering the conductive nanosized particles.

3. The method according to claim 1, wherein a width of the layer obtained by sintering the conductive nanosized particles of the first circuit pattern is narrower than the second circuit pattern.

4. The method according to claim 2, wherein:
a plurality of the second circuit patterns are formed on both sides of the region configured to mount the electronic component,
at least a pair of the first circuit patterns are formed within the region, and the pair of the first circuit patterns are respectively connected to the plurality of second circuit patterns on both sides of the region, and
the non-conductive layer is placed between the pair of the first circuit patterns.

5. The method according to claim 1, wherein an optically transparent substrate is used as the substrate, and wherein the step 4 comprises:

step 4-1: forming a second film of the conductive nanosized particles and conductive microsized particles, coated with the insulating material, by applying:
a solution wherein the conductive nanosized particles with a particle diameter less than 1 μm, the conductive microsized particles with a particle diameter of 1 μm or larger and the insulating material are dispersed, or
a solution wherein the conductive nanosized particles and the conductive microsized particles, each coated with a layer of the insulating material, are dispersed,
to the surface of the substrate in a desired shape, and step 4-2: forming the second circuit pattern by irradiating the second film with light in a predetermined pattern, from a backside of the substrate, sintering the conducting nanosized particles and the conductive microsized particles by the light.

6. The method according to claim 1, wherein an optically transparent substrate is used as the substrate, and wherein in the step 2, the film is irradiated with the light through the substrate from a backside thereof.

7. The method according to claim 5, wherein the film, after the first circuit pattern is formed, comprises a non-conductive layer which is continuous from the layer obtained by sintering the conductive nanosized particles.

8. The method according to claim 5, wherein a width of the layer obtained by sintering the conductive nanosized particles of the first circuit pattern is narrower than the second circuit pattern.

9. The method according to claim 2, wherein a width of the layer obtained by sintering the conductive nanosized particles of the first circuit pattern is narrower than the second circuit pattern.

10. The method according to claim 7, wherein a width of the layer obtained by sintering the conductive nanosized particles of the first circuit pattern is narrower than the second circuit pattern.

11. The method according to claim 7, wherein:
a plurality of the second circuit patterns are formed on both sides of the region configured to mount the electronic component,
at least a pair of the first circuit patterns are formed within the region, and the pair of the first circuit patterns are respectively connected to the plurality of second circuit patterns on both sides of the region, and
the non-conductive layer is placed between the pair of the first circuit patterns.

12. The method according to claim 5, wherein in the step 2, the film is irradiated with the light through the substrate from the backside thereof.

* * * * *